United States Patent [19]

Takeshita

[11] Patent Number: 4,605,862

[45] Date of Patent: Aug. 12, 1986

[54] SOLID STATE IMAGE PICKUP APPARATUS

[75] Inventor: Kaneyoshi Takeshita, Tokyo, Japan

[73] Assignee: Sony Corporation, Tokyo, Japan

[21] Appl. No.: 557,169

[22] PCT Filed: Feb. 10, 1983

[86] PCT No.: PCT/JP83/00040

§ 371 Date: Oct. 18, 1983

§ 102(e) Date: Oct. 18, 1983

[87] PCT Pub. No.: WO83/03031

PCT Pub. Date: Sep. 1, 1983

[30] Foreign Application Priority Data

Feb. 19, 1982 [JP] Japan .................. 57-25731

[51] Int. Cl.$^4$ .................. H04N 3/14; H04N 5/335
[52] U.S. Cl. .................. 250/578; 358/213
[58] Field of Search .............. 250/211 J, 211 R, 578;
357/24 LR, 31, 32; 338/15; 358/212, 213

[56] References Cited

U.S. PATENT DOCUMENTS 3,896,474  7/1975  Amelio et al. ............. 357/24 LR
4,354,104 10/1982  Chikamura et al. ......... 357/31
4,446,364  5/1984  Hayashi et al. ........... 250/578
4,460,912  7/1984  Takeshita et al. ......... 357/24 LR Primary Examiner—Davis L. Willis
Assistant Examiner—Stephone B. Allen
Attorney, Agent, or Firm—Hill, Van Santen, Steadman & Simpson

[57] ABSTRACT

In a solid state image pickup apparatus comprising a solid state image pickup device having photodetectors (1), transfer gate areas (6) and vertical transfer portions (2), and being formed such that the photodetectors (1) and the vertical transfer portions (2) are not covered with a light shielding layer (11), and a shutter mechanism provided to the solid state image pickup device; the shutter mechanism is made open and the relationship of $P_r \leq P_t < P_s$, where $P_s$, $P_t$ and $P_r$ are the potentials of the photodetector (1) the transfer gate area (6) and the vertical transfer portion (2), respectively, is held during a light receiving period, the shutter mechanism is shut and the relationship of $P_s \leq P_t < P_r$ is held during a reading out period, and the shutter mechanism is shut and the relationship of $P_t < P_s$ and $P_t < P_r$ is held during a charge transfer period, thereby to produce an image pickup signal output in response to the signal charge transferred by the vertical transfer portions (2).

2 Claims, 6 Drawing Figures

FIG. 1 – PRIOR ART
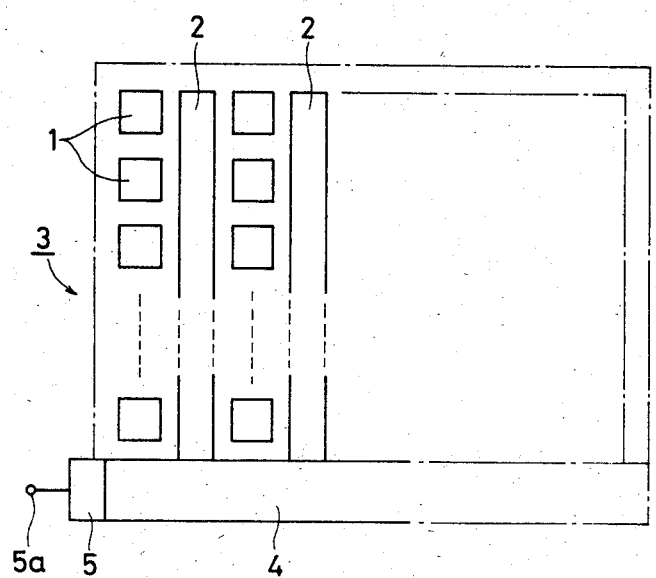
FIG. 2 – PRIOR ART
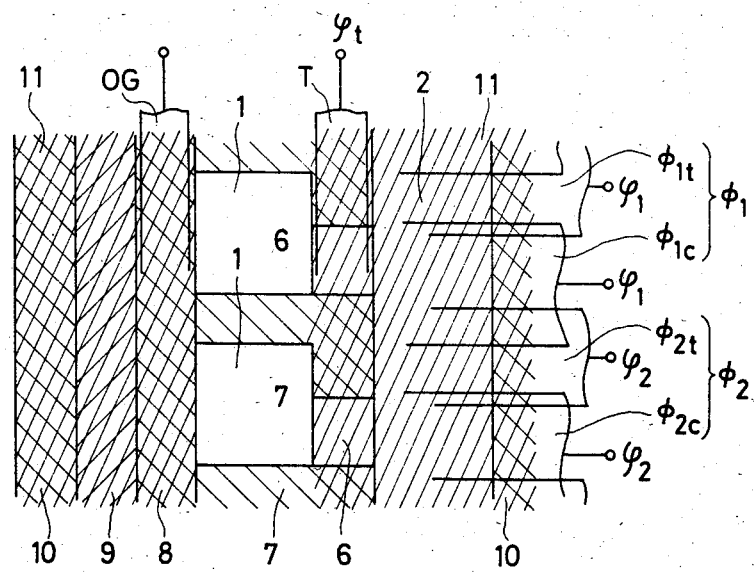

FIG. 3
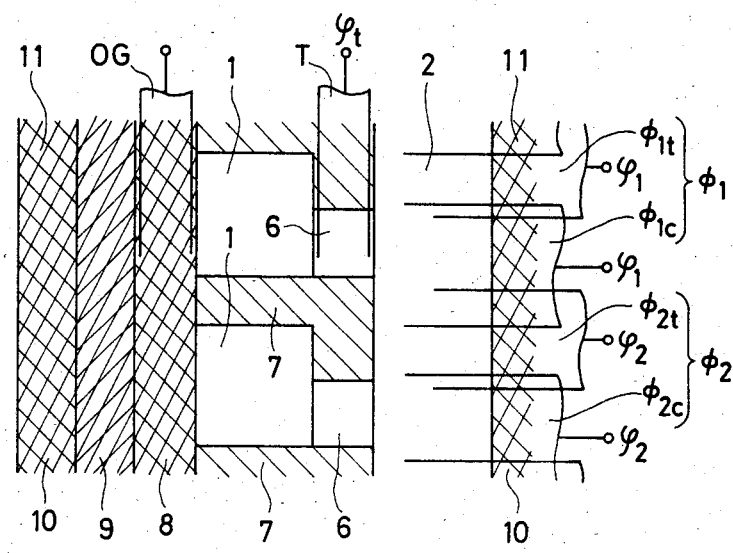
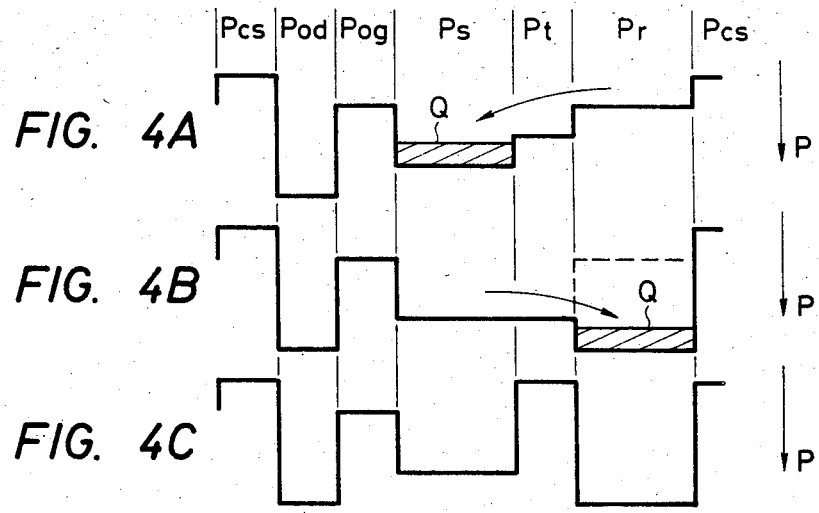
FIG. 4A
FIG. 4B
FIG. 4C

SOLID STATE IMAGE PICKUP APPARATUS

TECHNICAL FIELD

This invention relates to solid state image pickup apparatus employing a solid state image pickup device which comprises a charge transfer device, and more particularly, is directed to an improved solid state image pickup apparatus employing a solid state image pickup device of the interline transfer type and a shutter mechanism provided to the solid state image pickup device for producing an image pickup signal output representing a still image, in which the light-receiving aperture ratio is substantially increased so that the photo-sensitivity is improved.

TECHNICAL BACKGROUND

Solid state image pickup devices comprising a charge transfer device such as a charge coupled device (hereinafter referred to as a CCD) are classified broadly into the frame transfer type and the interline transfer type, and each of them is utilized in different way so as to make a good use of its advantages and features.

An example of a solid state image pickup device of the interline transfer type using a CCD is constituted as shown in FIG. 1, and comprises a photo-sensing and vertical transfer portion 3 which includes a plurality of photodetectors 1 arranged in horizontal and vertical rows and vertical transfer portions 2 each formed with a group of CCDs and provided along each of the vertical rows of the photodetectors 1, a horizontal transfer portion 4 coupled with the photo-sensing and vertical transfer portion 3 and an output portion 5 coupled with the horizontal transfer portion 4 and provided with a signal output terminal 5a, the whole of which are formed on a common semiconductor substrate.

In a solid state image pickup apparatus employing such a solid state image pickup device as mentioned above, a predetermined vertical transfer driving signal and a predetermined horizontal transfer driving signal are applied to the vertical transfer portions 2 and the horizontal transfer portion 4, respectively, so that vertical and horizontal charge transfers are performed in the solid state image pickup device. With such driving signals, signal charge obtained in the photodetectors 1 in response to the light received thereby during for example, one frame period is read out to the vertical transfer portions 2 and then transferred vertically toward the horizontal transfer portion 4 by the charge transfer operation of the vertical transfer portions 2 during each horizontal blanking period so that the signal charge produced in each horizontal row of the photodetectors 1 is transferred in turn to the horizontal transfer portion 4. The signal charge transferred to the horizontal transfer portion 4 is further transferred horizontally to the output portion 5 by the charge transfer operation of the horizontal transfer portion 4 during each horizontal video period and as a result of this an image pickup signal output is obtained at the signal output terminal 5a.

The photo-sensing and vertical transfer portion 3 mentioned above contains transfer gate areas 6 provided between each vertical row of the photodetectors 1 and the corresponding one of the vertical transfer portions 2, and a channel stop area 7 and an overflow control gate portion 8 provided around each of the photodetectors 1, as shown in FIG. 2. Further, an overflow drains 9 is provided contiguous to each of the overflow control gate portions 8, and each of the overflow drains 9 and the corresponding one of the vertical transfer portions 2 are separated by a channel stop area 10. The above mentioned various areas and portions are covered by insulating layer, and on the insulating layer, vertical transfer electrodes $\phi_1$ and $\phi_2$ each elongated in the horizontal direction are provided alternately in the vertical direction in the areas corresponding to the vertical transfer portions 2. Each vertical transfer electrode $\phi_1$ is composed of a charge storage electrode $\phi_{1c}$ and a charge transfer electrode (potential barrier electrode) $\phi_{1t}$, and each vertical transfer electrode $\phi_2$ is composed of a charge storage electrode $\phi_{2c}$ and a charge transfer electrode $\phi_{2t}$. In the vertical transfer portions 2, storage regions are formed under the charge storage electrodes $\phi_{1c}$ and $\phi_{2c}$ and transfer regions (potential barrier regions) are formed under the charge transfer electrodes $\phi_{1t}$ and $\phi_{2t}$, and each transfer region is subjected to ion implantation or is provided thereon with a thick insulating layer so as to have a potential well which is shallower (lower) than that of the storage region adjacent thereto and so as to form a potential barrier. Further, a transfer gate electrode T which extends in the vertical direction is provided on each group of the transfer gate areas 6 the electrode T is aligned in the vertical direction. An overflow control gate electrode OG which also extends in the vertical direction is provided on each overflow control gate portion 8. A light shielding layer 11 is also provided on the above mentioned various areas and portions except the areas of the photodetectors 1 so as to form a light shielded portion.

In the photo-sensing and vertical transfer portion 3 of the solid state image pickup device of the interline transfer type which uses the CCD described, a predetermined gating signal $\phi_t$ is supplied to the transfer gate electrodes T so that a transfer gate voltage is applied selectively to the transfer gate areas 6, and a predetermined bias voltage is supplied through the overflow control gate electrodes OG to the overflow control gate portions 8. Then, the vertical transfer electrodes $\phi_1$ and $\phi_2$ are supplied with two phase driving signals $\phi_1$ and $\phi_2$, respectively, and the voltages of these driving signals $\phi_1$ and $\phi_2$ are applied to the vertical transfer portions 2 positioned under the vertical transfer electrodes $\phi_1$ and $\phi_2$. With the driving signals $\phi_1$ and $\phi_2$, signal charges which are stored in the photodetectors 1 are read out through the transfer gate areas 6 to the vertical transfer portions 2 during every field period, for example, and the signal charges read out to the vertical transfer portions 2 are transferred vertically to the horizontal transfer portion 4 during each period corresponding to the horizontal blanking period.

When the previously proposed solid state image pickup device of the interline transfer type using the CCD which has a photo-sensing and vertical transfer portion 3 such as described above is in operation for producing an image pickup signal output, the light receiving portion upon which the light from an object is received is limited to the area of the photodetectors on which the light shielding layer is not provided and therefore the light receiving aperture, ratio, that is, the ratio of the area of the part of the aperture for receiving the light to the area of the whole photo-sensing and vertical transfer portion 3 is quite low. Consequently, the photosensitivity of the device is low, and especially, in the case of operation for producing an image pickup signal output representing a still image in which the light is received during the short period in which a shutter mechanism which is provided over the photo-sensing and vertical transfer portion 3 is open. The image pickup output signal is obtained in response to the signal charge stored in the photodiodes 1 during such short period, and an image pickup signal output having sufficient dynamic range and with a high signal to noise ratio can not be obtained.

DISCLOSURE OF THE INVENTION

Accordingly, it is an object of the present invention to provide an improved solid state image pickup apparatus which has a solid state image pickup device of the interline transfer type and a shutter mechanism which is provided for the solid state image pickup device for producing an image pickup signal output representing a still image, in which the light receiving aperture ratio is substantially increased so that the photo-sensitivity is improved during the operation thereof.

According to an aspect of the present invention, there is provided a solid state image pickup apparatus comprising a solid state image pickup device of the interline transfer type having photodetectors for producing signal charges in response to the light received thereby and for storing the signal charge produced therein. Transfer gate areas for reading out the signal charge from the photodetectors are provided as well as, transfer portions for transferring the signal charges read out from the photodetectors which are formed such that the photodetectors and the transfer portions are not covered with a light shielding layer. A shutter mechanism is provided for the solid state image pickup device, wherein the shutter mechanism opened and the relationship of $P_r \leq P_t < P_s$, where $P_s$, $P_t$ and $P_r$ are the potentials of the photodetector, the transfer gate area and the transfer portion, respectively, are maintained during a light receiving period and then, the shutter mechanism is shut and the relationship $P_s \leq P_t < P_r$ is maintained during a reading out period, while the shutter mechanism is shut and the relationship of $P_t < P_s$ and $P_t < P_r$ is maintained during a charge transfer period, thereby to produce an image pickup signal output in response to the signal charges transferred by the transfer portions.

In the solid state image pickup apparatus according to the present invention thus constituted, when the shutter mechanism is opened and the solid state image pickup device of the interline transfer type receives the light coming through the shutter mechanism, the vertical transfer portions act substantially as light receiving portions in addition to the photodetectors and therefore the light receiving aperture ratio is substantially increased so that the photo-sensitivity is greatly improved. Accordingly, with the apparatus according to the present invention, an image pickup signal output representing a still image with enlarged dynamic range and with a superior signal to noise ratio can be obtained and it is possible to have an image pickup signal output with high speed shuttering operation. Futher, since excessive or unnecessary charges are not contained in the signal charges stored and transferred in the solid state image pickup device used in the apparatus according to the present invention, an image pickup signal output which produces a picture without deterioration caused by smear or blooming can be obtained.

BRIEF DESCRIPTION OF THE DRAWINGS

FIG. 1 is a schematic plane view showing a solid state image pickup device of the interline transfer type;

FIG. 2 is a plane view showing an enlarged portion of a photo-sensing and vertical transfer portion in a previously proposed solid state image pickup device of the interline transfer type;

FIG. 3 is a plane view showing an enlarged portion of a photo-sensing and vertical transfer portion in a solid state image pickup device of the interline transfer type employed in one embodiment of the present invention; and FIGS. 4A, 4B and 4C are waveform diagrams used for explaining the operation of the embodiment of the present invention.

EMBODIMENT MOST PREFERABLE FOR WORKING OF THE INVENTION

An embodiment which is most preferable for the present invention will be described with reference to FIGS. 3 and 4.

FIG. 3 shows a configuration of a photo-sensing and vertical transfer portion in a solid state image pickup device of the interline transfer type which is employed in an embodiment of solid state image pickup apparatus according to the present invention.

The solid state image pickup device of the interline transfer type having a portion thereof as shown in FIG. 3 comprises a CCD and has the configuration which is similar to that of FIG. 1. In the photo-sensing and vertical transfer portion shown in FIG. 3, photodetectors 1, vertical transfer portions 2, transfer gate areas 6, channel stop areas 7, oveflow control gate portions 8, overflow drains 9 and channel stop areas 10 are formed in the same manner as those in the previously proposed solid state image pickup device of the interline transfer type using the CCD shown is FIG. 2, and further vertical transfer electrodes $\phi_1$ each composed of a charge storage electrode $\phi_{1c}$ and a charge transfer electrode $\phi_{1t}$, vertical transfer electrodes $\phi_2$ each composed of a charge storage electrode $\phi_{2c}$ and a charge transfer electrode $\phi_{2t}$, transfer gate electrodes T and overflow control gate electrodes OG are procided also in the same manner as shown in FIG. 2.

The photo-sensing and vertical transfer portion shown in FIG. 3 has a light shielded portion which is different from that in the photo-sensing and vertical transfer portion shown in FIG. 2. In the photo-sensing and vertical transfer portion shown in FIG. 3, a light shielding layer 11 is provided only on the overflow control gate portion 8, the overflow drain 9 and the channel stop area 10 to form the light shielded portion. Accordingly, the vertical transfer portion 2 the, transfer gate area 6 and the channel stop area 7 form light receiving portions, respectively, which are not covered with the light shielding layer 11 in in the same manner as the photodetector 1.

The solid state image pickup apparatus embodying the present invention is constructed so as to employ the solid state image pickup device of the interline transfer type comprising the CCD which has such a photo-sensing and vertical transfer portion as mentioned above, and has a shutter mechanism for limiting the light entering into the photo-sensing and vertical transfer portion so as to produce an image pickup signal output representing a still image. The light coming from the outside is allowed to enter into the photo-sensing and vertical transfer portion only when the shutter mechanism is open.

During the operation for producing the image pickup signal output, the potential of each portion or area in the photo-sensing and vertical transfer portion shown in FIG. 3 is controlled. In such case, during a light receiving period in which the light is received by the photo-sensing and vertical transfer portion, and the photodetectors 1 store signal charges therein in response to the received light, the shutter mechanism is opened and the relationship among the potentials of portions and areas in the photo-sensing and vertical transfer portion is arranged to be as shown in FIG. 4A, where $P_s$ stands for the potential of the photodetector 1, $P_r$ stands for the potential of the vertical transfer portion 2, $P_t$ stands for the potential of the transfer gate area 6, $P_{og}$ stands for the potential of the overflow control gate portion 8, $P_{od}$ stands for the potential of the overflow drain 9, and $P_{cs}$ stands for the potential of the channel stop area 10. Further, during a reading out period in which the signal charges stored in the photodetectors 1 is read out through the transfer gate areas 6 to the vertical transfer portions 2, the shutter mechanism is shut and the relationship among the voltages on the portions and areas in the photo-sensing and vertical transfer portion is arranged to be as shown in FIG. 4B, and during a charge transfer period in which the signal charges are transferred to the vertical transfer portions 2 and then further transferred to the horizontal transfer portion 4, the shutter mechanism is maintained shut and the relationship among the voltages on the portions and areas in the photo-sensing and vertical transfer portion is as shown in FIG. 4C. In FIGS. 4A, 4B and 4C, the potential P becomes high (deep) in the downward direction. Broken lines provided in connection with the potential $P_r$ in FIG. 4B show the potential of the vertical transfer portions 2 for the photodetectors 1 from which the signal charges are not read out during a certain field period in the field interlace reading operation and in which signal charges stored in one of two vertically adjacent photodetectors 1 and signal charges stored in the other of the two photodetectors 1 are read out during every field period. In the charge transfer period, the potential $P_r$ of the vertical transfer portion 2 varies under the vertical transfer electrodes $\phi_1$ and $\phi_2$ in response to the driving signal supplied thereto and the potential $P_r$ shown in FIG. 4C represents the deeper potential level.

As apparent from FIGS. 4A, 4B and 4C, each of the potentials $P_s$, $P_{og}$, $P_{od}$ and $P_{cs}$ of the photodetector 1, overflow control gate portion 8, overflow drain 9 and channel stop area, respectively, are maintained so as to be constant throughout the light receiving period, reading out period the and the charge transfer period, and the relationship of $P_{cs} < P_{og} < P_s < P_{od}$ is maintained. Accordingly, when excessive charge which exceed the potential barrier $P_{og}$ are produced in the photodetectors 1, such excessive charges overflow into the overflow drain 9 are drained away.

On the other hand, both the potentials $P_r$ of the vertical transfer portion 2 and the potential $P_t$ of the transfer gate area 6 vary in response to the voltages of the driving signals $\phi_1$ and $\phi_2$ supplied to the vertical transfer electrodes $\phi_1$ and $\phi_2$ and the gating voltage resulting from the gating signal $\phi_t$ which is supplied to the transfer gate electrode T, respectively.

First, during the light receiving period, the relationship of $P_r < P_t < P_s$ is maintained, as shown in FIG. 4A. During this period, the photodetectors 1, the vertical transfer portions 2 and the transfer gate areas 6, each of which is not covered with the light shielding layer 11, receive the light coming through the open shutter mechanism and produce charges in response to the received light. Since the relationship of $P_r < P_t < P_s$ is maintained, the charges produced in the photodetectors 1, the vertical transfer portions 2 and the transfer gate areas 6 are collected into the photodetectors 1 having the highest potential among them and are stored therein to obtain the signal charge Q. In this case, the relationship of $P_r = P_t < P_s$ can be used instead of the relationship of $P_r < P_t < P_s$. In a manner such as mentioned above, the charges produced in the vertical transfer portions 2 and the transfer gate areas 6 become the signal charges in addition to the charges produced in the photodetectors 1, and especially, the vertical transfer portions 2 act as a light receiving portion having relatively broad areas, so that the signal charges produced in response to the light entering into the photo-sensing and vertical transfer portion is greatly increased. That is, the light receiving aperture ratio is substantially increased and therefore the photosensitivity is improved.

Then, during the reading out period, the relationship of $P_s = P_t < P_r$ is maintained, as shown in FIG. 4B, consequently, the signal charges stored in the photodetectors 1 are read out through the transfer gate area 6 into the vertical transfer portions 2. In this case, the relationship of $P_s < P_t < P_r$ can be used instead of the relationship of $P_s = P_t < P_r$. During this period, since the shutter mechanism is shut, the light coming from the outside can not reach any of the photodetectors 1, or the vertical transfer portions 2 or the transfer gate areas 6. In the case of the field interlace reading operation, the potential $P_r$ of the vertical transfer portion 2 cooresponding to the photodetector 1 from which the signal charge is not read out is lower than the potential $P_t$ of the transfer gate area 6, as shown by the broken lines in FIG. 4B.

Further, during the charge transfer period, the relationship of $P_t < P_s$, $P_t < P_r$ is maintained, and the potential $P_r$ varies to take a high level and a low level in response to vertical transfer pulses obtained in the driving signals $\phi_1$ and $\phi_2$, so that the signal charge Q is transferred to the horizontal transfer portion 4 from the vertical transfer portions 2 during each period corresponding to the horizontal blanking period.

During this period also, the shutter mechanism is shut and therefore the light coming from the outside can not reach any of the photodetectors 1, or the vertical transfer portions 2 or the transfer gate areas 6.

The signal charge Q transferred to the horizontal blanking period transfer portion 4 during each period corresponding to the horizontal blanking period as described above, is further transferred to the output portion 5 from the horizontal transfer portion 4 during each period corresponding to the horizontal video period and as a result of this an image pickup signal output representing a still image is obtained at the signal output terminal 5a in the form of successive segments each corresponding to one field period.

With regard to the vertical transfer electrodes $\phi_1$ and $\phi_2$ and the transfer gate electrode T provided in the photo-sensing and vertical transfer portion shown in FIG. 3, it is expedient to mount the transfer gate electrode T first and then to mount the vertical transfer electrodes $\phi_1$ and $\phi_2$ on the transfer gate electrode T with the insulating layer therebetween.

Although, in the embodiment described above, the vertical transfer electrodes $\phi_1$ and $\phi_2$ are adapted to cause the vertical charge transfer to be performed in the two-phase transfer mode with two-phase driving signals, it is also possible to provide other vertical transfer electrodes which are adapted to cause the vertical charge transfer to be performed in the three or four-phase transfer mode with three or four-phase driving signals, in place of the vertical transfer electrodes $\phi_1$ and $\phi_2$. Further, in place of the overflow drain 9 which is formed two-dimensionally in the above embodiment, other overflow drains formed in different manners can be provided.

APPLICABILITY FOR INDUSTRIAL USE

As described above, the solid state image pickup apparatus according to the present invention can produce an image pickup signal output representing a still image with enlarged dynamic range and superior signal to noise ratio, and therefore it is quite suitable for using in a high-grade still television camera which miniaturized and light.

I claim:

1. A solid state image pickup apparatus comprising a solid state image pickup device of the interline transfer type which has a photodetector (1) for producing signal charges in response to light received thereon and for storing the signal charges produced therein, a transfer gate area (6) formed adjacent said photodetector (1) for reading out the signal charges stored in the photodetectors (1), and vertical transfer portions (2) formed adjacent said transfer gate area (6) for transferring the signal charges read out from the photodetectors (1), said photodetectors (1), and said transfer portions (2) are free of a light shielding layer (11), a shutter mechanism is provided for the solid state image pickup device, and when the shutter mechanism is opened the relationship $P_r \leqq P_t < P_s$, where $P_s$, $P_t$ and $P_r$ are the potentials of the photodector (1), the transfer gate area (6) and the transfer portion (2), respectively are maintained during a light receiving period, and when the shutter mechanism is shut the relationship $P_s \leqq P_t < P_r$ is maintained during a reading out period, and when the shutter mechanism is shut the relationship of $P_t < P_s$ and $P_t < P_r$ is maintained during a charge transfer period, so as to produce an image pickup output signal in response to the signal charges transferred by the transfer portions (2).

2. A solid state image pickup apparatus according to claim 1, wherein said solid state image pickup device of the interline transfer type further has a channel stop area (7) mounted between each two adjacent photodetectors (1), and said channel stop areas (7) and said transfer gate areas (6) are free of the light shielding layer (11).

* * * * *